United States Patent [19]

Larsson et al.

[11] Patent Number: 5,241,690
[45] Date of Patent: Aug. 31, 1993

[54] METHOD FOR REGULATING POWER IN A DIGITAL MOBILE TELEPHONY SYSTEM

[75] Inventors: Stig M. Larsson, Linköping; Hans E. Andersson, Vreta Kloster, both of Sweden

[73] Assignee: Telefonaktiebolaget L M Ericsson, Stockholm, Sweden

[21] Appl. No.: 712,930

[22] Filed: Jun. 7, 1991

[30] Foreign Application Priority Data

Jun. 21, 1990 [SE] Sweden .............................. 9002228

[51] Int. Cl.$^5$ .............................................. H04B 7/00
[52] U.S. Cl. ...................................... 455/54.1; 455/69; 455/70; 455/116; 455/226.2; 375/98
[58] Field of Search ........................... 455/67.3, 69–70, 455/89, 116, 126, 127, 234.1, 234.2, 226.2, 226.3, 54.1, 54.2, 56.1; 375/98; 370/77, 95.3

[56] References Cited

U.S. PATENT DOCUMENTS

| | | | |
|---|---|---|---|
| 4,495,648 | 1/1985 | Giger | 455/73 |
| 4,556,760 | 12/1985 | Goldman | 379/60 |
| 4,757,502 | 7/1988 | Meuriche et al. | 375/98 |
| 4,777,653 | 10/1988 | Bonnerot et al. | 455/69 |
| 4,811,421 | 3/1989 | Havel et al. | 455/69 |
| 4,870,698 | 9/1989 | Katsuyama et al. | 455/67.1 |
| 5,081,653 | 1/1992 | Saito | 375/98 |
| 5,128,629 | 7/1992 | Trinh | 455/127 |
| 5,129,098 | 7/1992 | McGirr et al. | 455/126 |

FOREIGN PATENT DOCUMENTS 0312690  4/1989  European Pat. Off. .
0314962  5/1989  European Pat. Off. .
0322525  7/1989  European Pat. Off. .

Primary Examiner—Reinhard J. Eisenzopf
Assistant Examiner—Andrew Faile
Attorney, Agent, or Firm—Burns, Doane, Swecker & Mathis

[57] ABSTRACT

The present invention relates to a method of regulating or adjusting the transmission power when transmitting signals between a mobile station and a base station in a digital mobile telephony system. The output power is regulated to maintain the transmission power at an optimum level to prevent unnecessary disturbance of neighboring channels transmitting information on the same frequency and to insure that the transmitted information is interpreted properly in the receiver. The measured values of signal strength and signal-transmission quality are collected, and their mean values are calculated. An anticipated value of signal strength and transmission quality is then calculated at a next time-point provided that the transmission power is maintained unchanged in relation to the transmission power at the present or instant time period ($t_0$). The transmission power at the next time period ($t_1$) is regulated on the basis of these anticipated signal strength and quality values. The transmission power is increased when the anticipated transmission quality is less than that desired and is decreased when the anticipated quality is higher than the highest permitted quality or when the anticipated signal strength is greater than the maximum permitted value. Otherwise, the transmission power is maintained unchanged.

9 Claims, 5 Drawing Sheets

METHOD FOR REGULATING POWER IN A DIGITAL MOBILE TELEPHONY SYSTEM

FIELD OF THE INVENTION

The present invention relates to a method for controlling transmission power in radio communication between a mobile station and a base station of a digital mobile radio system.

BACKGROUND OF THE INVENTION

A cellular mobile radio system may comprise a plurality of cells. Each cell has at least one base station for simultaneous communication with a number of mobile stations. Signal transmission is effected between the base station of a cell and the mobile stations served by the base station in said cell by transmitting and receiving radio signals, for instance when the mobile stations are used for calling purposes.

It is known to have a so-called fixed frequency plan in mobile radio systems which utilize FDMA and/or TDMA in order to obtain a large number of radio communication channels. That is, signals are transmitted in each cell between the base station and the mobile stations on a given number of determined radio frequencies. For instance, a cell can be assigned twenty different signal transmission frequencies. The cells are divided logically into groups, with several cells in each group. The cells within one group utilize different radio frequencies, although cells in different groups may utilize the same radio frequencies.

An alternative to a fixed frequency plan for FDMA and TDMA is the adaptive or dynamic assignment of channels/frequencies. All, or at least some, of the available radio frequencies and, in the case of TDMA, also the time slots on the radio frequencies, constitute a common resource for all cells, or at least for several neighbouring cells. One example of dynamic channel assignment is described in U.S. Pat. No. 4,736,453.

An alternative to FDMA and TDMA when desiring a large number of radio communication channels is CDMA, Code Division Multiple Access. In a mobile radio system in which CDMA is applied and in which traffic is not unduly excessive, it is conceivable to use just a single radio frequency, or rather a single radio frequency band. This radio band has no fixed division of separate time slots which are allocated to separate stations. Instead the whole radio band can be used simultaneously in different ways by all of the mobile stations. An example of CDMA is described in EP 0189695.

Power regulation in mobile radio systems with analogue information transmission is of a relatively simple kind and the adjustment is a relatively rough adjustment. See in this respect U.S. Pat. No. 4,485,486. According to one proposed standard for digital mobile radio systems, such as GSM in Europe and EIA/TIA IS-54 in the U.S.A., protocol is found for the transmission of measurement information and commands concerning transmission power. As is well known, there is at present no published technology for regulating power transmission in digital mobile telephony systems with respect to prevailing radio-signal propagation conditions, signal disturbance, system traffic, etc.

SUMMARY OF THE INVENTION

In a mobile telephony system in which the same radio frequency or frequencies is/are used for several connections, such as telephone calls or data communication, in one of the aforedescribed manners, or possibly in some other manner, there is a risk that a connection will be subjected to excessively large disturbances from other connections, since the radio signals that are transmitted simultaneously, at least in part, on the same frequency or frequencies can interfere with one another to an excessive extent. Depending on whether a system has a fixed frequency plan or dynamic channel assignment, and also on whether the system utilizes FDMA or TDMA or CDMA, interference can occur either between communication channels both operating in a single cell or each operating in different cells, these channels use the same radio frequency and/or the same time slot for the transmission of information. The risk of excessive disturbance is particularly high when the transmission powers of transmitted radio signals are not mutually adapted. This lack of adaptation can occur either within the confines of a single cell or between different cells. In the latter station, the transmission powers in one cell are excessively high in relation to the powers in another cell. When the disturbances on an established connection, for example a telephone call or data communication, become so excessive that transmitted information, speech or data cannot be interpreted or decoded in the receiver, the connection is broken. It is therefore desirable to maintain the transmission power of disturbance signals as low as possible, so as to avoid these disturbance problems.

Another reason for maintaining the transmission power at the lowest possible level is because this enables the energy consumption of mobile stations to be reduced, thereby enabling the batteries that power portable mobile stations to have a smaller capacity and be less bulky. If the batteries are smaller than the portable mobile stations can be made smaller as well.

However, it is not possible to transmit signals of excessively low power, since there is then the risk that the signals will be too weak upon reception for the information contained therein to be interpreted or decoded in the receiver. This can cause an established connection to be broken, as previously mentioned.

Accordingly, the object of the present invention is to solve the aforesaid problem by regulating the transmission power of a mobile station or a base station in a manner that maintains the transmission power at the lowest possible level, so as to avoid crating an unnecessary disturbance problem while, at the same time, maintaining the transmission power constantly at a sufficiently high level for the transmitted information to reach the receiver and to be interpreted or decoded therein.

Thus, the invention relates to a method for regulating the transmission power of a mobile station or a base station in a manner such that said power will be constantly maintained at an optimum. In brief, the method involves collecting measurement values of signal strength and signal transmission quality over two mutually adjacent time periods from the present or instant time-point and backwards. The mean values of signal strength and of signal transmission quality are calculated and estimated on the basis of these measurement values. An anticipated value of the signal level and of the quality of the signal transmission at the next point in time are calculated with the aid of the aforesaid calculated mean values, while taking into account the environment in which the mobile station is located, provided that the transmission power is maintained unchanged in relation to the power transmitted at the present point in time. The transmission power is finally regulated with the aid of the anticipated values of transmission quality and signal level, so that the power transmitted at the next point in time is increased when the anticipated transmission quality is poorer than that desired, and is decreased either when the anticipated value of transmission quality is higher than the highest permitted quality or when the anticipated value of the signal strength is greater than the maximum permitted value, the transmission power otherwise being maintained unchanged.

Since power control is effected on the basis of what can be expected to happen to the signal level and to the quality of signal transmission at the next, future point in time if the power output is maintained constant in comparison with the present point in time, the power transmitted can often be controlled or regulated in phase with the need for a change in the power output. Transmission power may, for instance, often be increased at the same time that the need for higher power occurs, since the need is anticipated. Consequently, transmission power can often be maintained continuously at an optimal level, i.e. at the lowest possible level but, nevertheless, sufficiently high for the transmitted information to be interpreted in the receiver. The actual adjustment of the transmission power is computer controlled and can be based on a few relatively simple conditions. This enables the power adjustment time to be kept short, which is necessary if the power is to be regulated in phase with the need for such regulation.

DETAILED DESCRIPTION OF THE PREFERRED EMBODIMENTS

Figure 1:
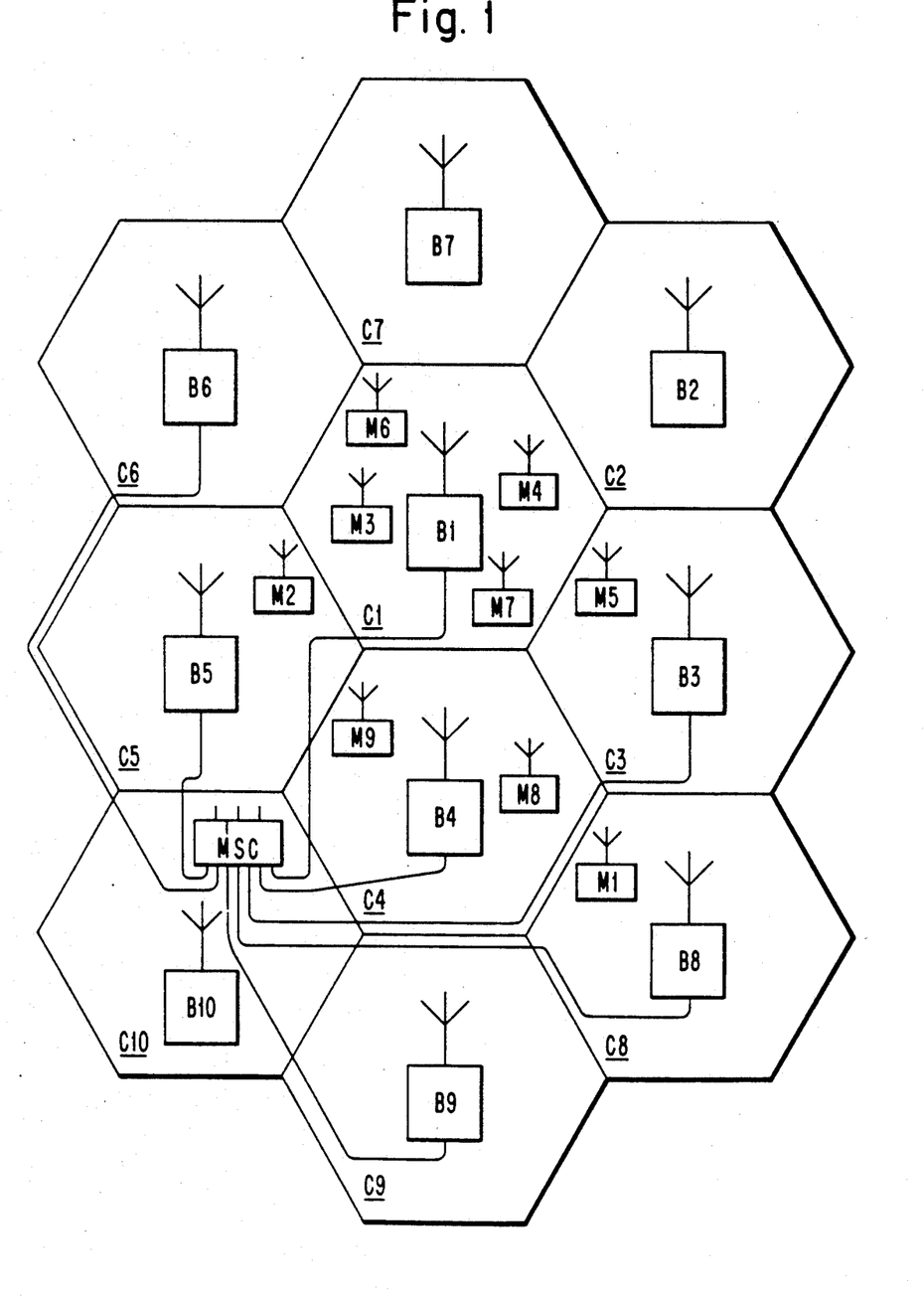
FIG. 1 illustrates a cell-divided mobile radio system.

FIG. 1 illustrates ten cells, C1 to C10, included in a cellular mobile radio system. Each cell C1 to C10 has a base station B1 to B10, denoted with the same number as the cell. The system illustrated in FIG. 1 also includes nine mobile stations M1 to M9 which are movable within a single cell and also from one cell to another. The invention is applied normally in a cellular mobile system which includes far more than ten cells/base stations and nine mobile stations. More specifically, there are normally many more mobile stations than base stations.

The system illustrated in FIG. 1 also includes a mobile radio telephone exchange MSC which is connected to all of the illustrated ten base stations by means of cables. The mobile radio exchange may also be cable-connected to a stationary, public telephone network or to a stationary private telephone network. Not all of the cables from the exchange are shown in FIG. 1.

The mobile system illustrated in FIG. 1 includes at least one duplex radio channel (two simplex channels) which is common to all base stations and mobile stations. The radio channel may be divided into time slots. No radio channel or time slot is reserved exclusively for one particular base station or one particular mobile station. The radio channel/radio channels/time slots are instead a common resource for use by base stations and mobile stations in accordance with requirements and with prevailing traffic. In some cases, the mobile radio exchange may make any allocation it deems necessary with respect to the radio frequency and the time slot on which a mobile station shall transmit when a number of alternatives are available.

Figure 2:
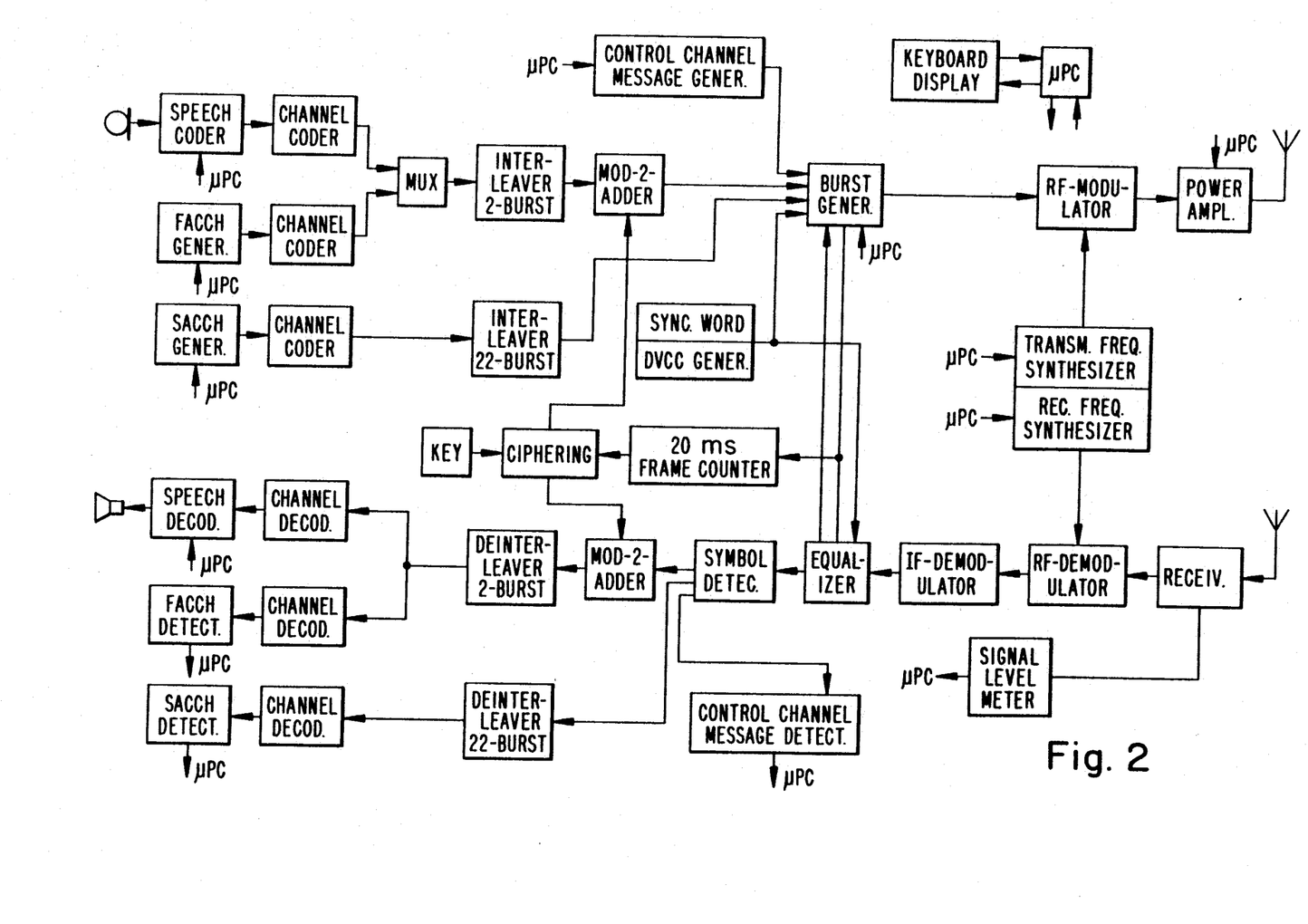
FIG. 2 is a block schematic of a mobile station.
Figure 3:
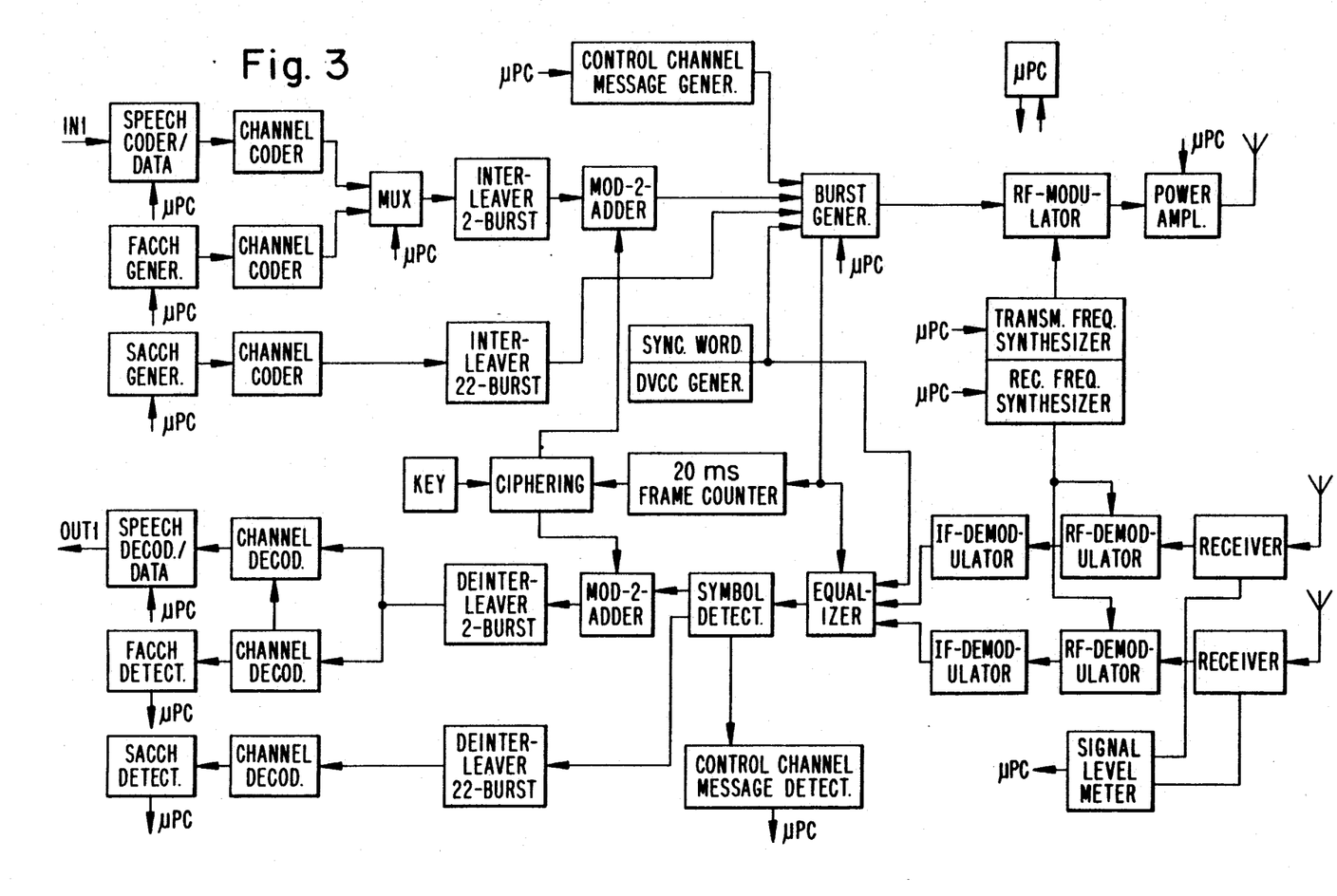
FIG. 3 is a block schematic of a base station.

Numerous digital cellular mobile radio systems have been proposed in the art and consequently the person skilled in this art does not require a detailed description of how a system, such as the one illustrated in FIG. 1, operates in order to apply the invention. For the sake of completeness, it is recommended that the person who is not skilled in this art should study specifications and specification drafts for the GSM and EIA/TIA IS-54 systems for information on digital mobile radio systems which use TDMA. Several base stations and mobile stations for digital cell-divided mobile radio systems have been proposed in the art, and consequently it is not thought necessary to describe such stations in detail in order for the person skilled in this art to be able to practice the invention. For the sake of simplicity and with consideration to the person not skilled in this art, FIGS. 2 and 3 of the present specification illustrate conceivable block schematics for a base station and a mobile station respectively for use in a system illustrated in FIG. 1. The illustrated base and mobile stations are constructed for communication with one another in accordance with EIA/TIA, Cellular System, Dual-Mode Mobile Station-Base Station Compatibility Standard, IS-54.

The present invention relates to a method for controlling or regulating the power of transmitted signals when transmitting signals between a mobile station and a base station, in a cellular digital mobile radio system, so as to maintain the power level constantly at an optimum. The power level is optimal when it is as low as possible, so as not to unnecessarily disturb other channels which use the same frequency for signal transmission, at least partially simultaneously, but, nevertheless, sufficiently high for the information transmitted to reach the receiver. Described in the following is an exemplifying embodiment of a method in which the power of the signal transmitted from the mobile station is regulated by calculations and commands from the controlling base station.

The transmission power is regulated with the aid of a computer which is controlled externally by two measurable magnitudes, namely signal level and signal transmission quality. These magnitudes are measured in the receiver, which in this example is the base station. Signal levels may be measured by sampling in a known manner, for example once per half-second.

The quality of the signal transmission is measured by estimating, or measuring, bit error content/bit error rate on the communication concerned. For example, in the case of a digital mobile radio system of GSM or TIA type, or a similar type, the signal quality can be measured by assessing the error rate/error content of the digital symbols (normally the number of bits which are in error in relation to the total number of bits) in a manner similar to the manner proposed in a contribution from Italtel within the framework of the work carried on the GSM system and described in a GSM document entitled GSM/WP2 Doc. 17/88. Based on the method proposed by Italtel, Ericsson proposed in a contribution to TIA, Technical Subcommittee, TR-45 Digital Cellular Standards, meeting on Aug. 29, 1989, in San Diego, Calif., a method of measuring and transmitting information relating to bit error rate in a digital cellular system according to EIA/TIA intended for the U.S.A.

Measurement data is stored continuously in the computer, for use in forming means values. (See Square 1 in the flow chart) of FIG. 4. Two mean values representing signal level and signal quality respectively are formed from the collected measurement data. (Square 2 in the flow chart). A diagram of the collected measurement data is given in FIG. 5. The horizontal axes show time t. The vertical axis of the upper diagram shows signal level SS, measured in decibels dB, whereas the vertical axis of the bottom diagram shows quality QQ, measured in terms of the relative number of bit errors in a received signal. A first mean value of respective magnitudes is formed from measurement data collected during a first time period A1 from earlier time points up to and including the present time-point. Another mean value of respective magnitudes is formed from measurement data collected during a second time period A2 which is the nearest preceding time period to the first mentioned time period A1. Thus, according to the present example, a first signal-level mean value $MV\_1\_SS$ is formed from four different sets of measurement data obtained at the time-points $t_{-3}$, $t_{-2}$, $t_{-1}$, $t_{-0}$. A first quality mean-value $MV\_1\_QQ$ is formed from measurement data obtained at the same time-points. Then, according to the illustrated example, a second signal-level mean value $MV\_2\_SS$ is formed from six different sets of measurement data obtained at the time-points $t_{-9}$, $t_{-8}$, $t_{-7}$, $t_{-6}$, $t_{-5}$, $t_{-4}$, and, finally a second quality mean-value $MV\_2\_QQ$ is also formed from the measurement data obtained at these time-points.

Figure 4:
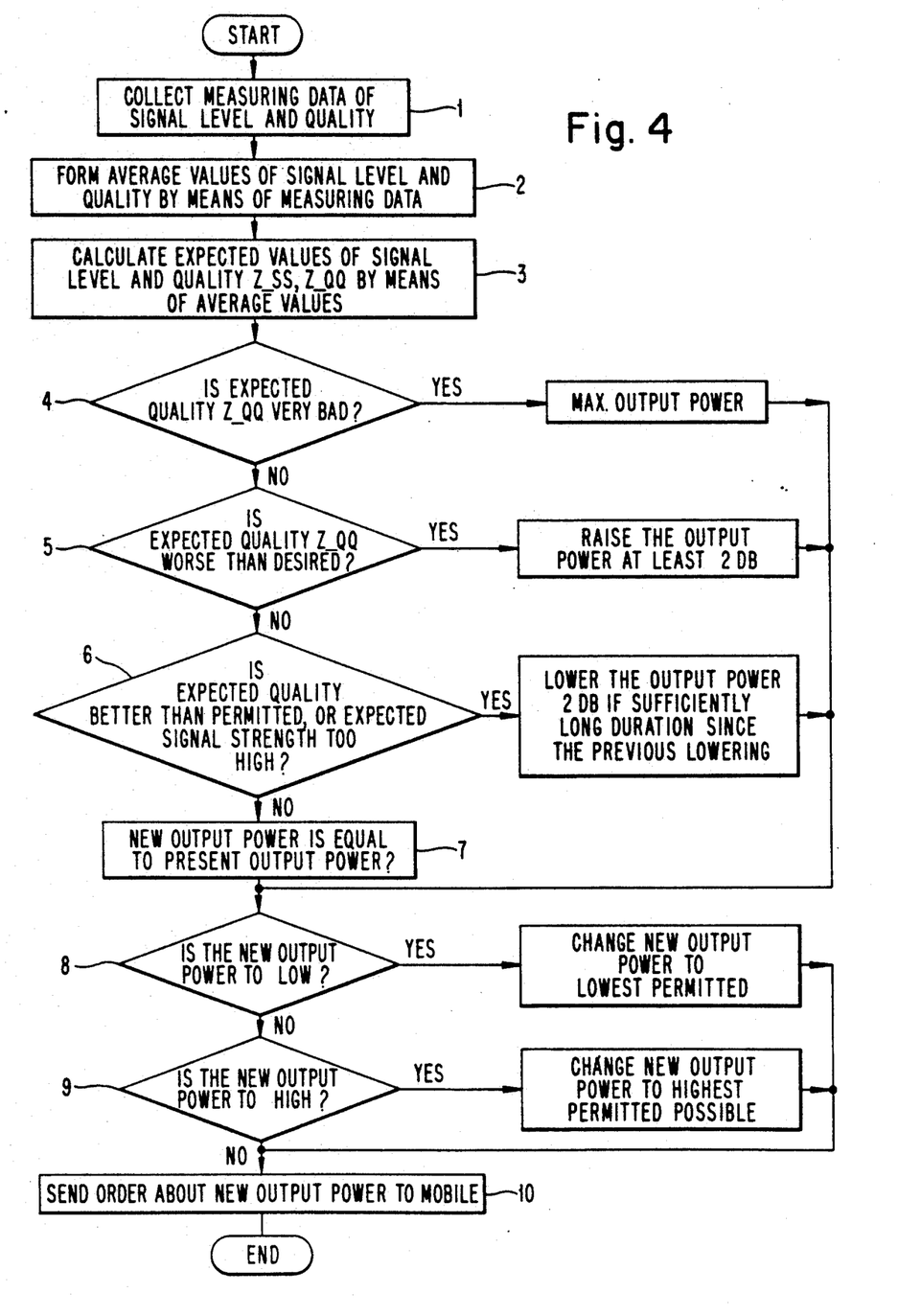
FIG. 4 is a flow diagram illustrating power control.
Figure 5:
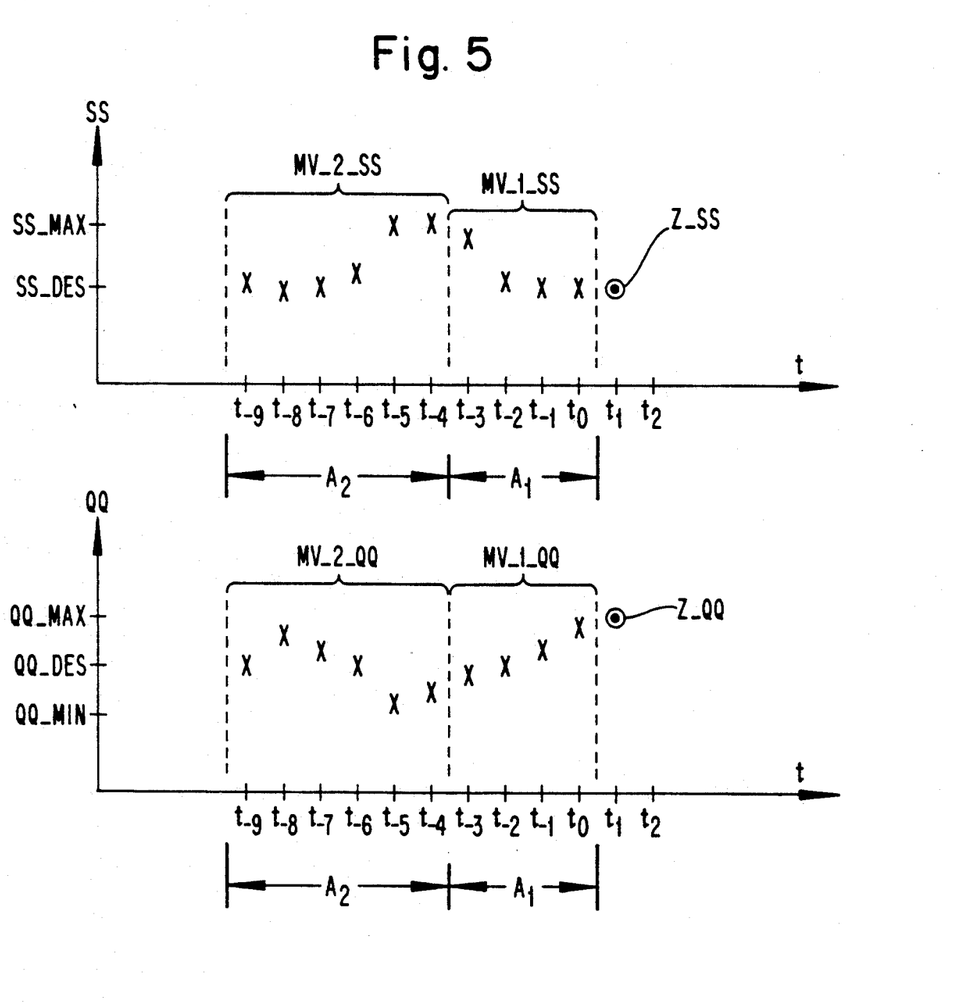
FIG. 5 is a diagram of measurement data collected over two mutually sequential time periods.

On the basis of these calculated mean values of the signal level, there is calculated an anticipated value $Z\_SS$ of the signal level at the next time-point $t_1$ one-half second forward in time, provided that the power of the transmitted signal is unchanged in comparison with the power transmitted at the present or instant time-point $t_0$ (Square 3 in the flow sheet). This calculation is made by taking into account the environment in which the base station and the mobile station are located. This is done with the aid of a signal environment factor $SS\_K$. According to the illustrated example, the anticipated value $Z\_SS$ of the signal level is calculated in the following manner:

$$Z\_SS = MV\_2\_SS + SS\_K * (MV\_1\_SS - MV\_2\_SS)$$

An anticipated value $Z\_QQ$ of the quality of the signal transmission at the next time-point $t_1$ is calculated in a corresponding manner, with the assumption being that the power of the transmitted signal will be unchanged from the present time-point $t_0$. Similar to the calculation of anticipated signal level $Z\_SS$, a quality environment factor $QQ\_K$ is used to take into account; the environment in which the mobile and the base station are located. Thus, the anticipated quality value $Z\_QQ$ is calculated in the following manner:

$$Z\_QQ = MV\_2\_QQ + QQ\_K * (MV\_1\_QQ - MV\_2\_QQ)$$

As will be evident from the above formulae, the two calculations of the anticipated values are carried out according to one and the same pattern. As previously mentioned, the environment factors, $SS\_K$ and $QQ\_K$ respectively, which are multiplied with the difference between the first and the second mean values, are assigned a value which is dependent on the environment in which the mobile station and the base station are located. The value depends on the nature of the environment in the cell of the base station. For example, when the cell includes a town or city environment, rapid trend detection is desired, since the conditions for radio-signal propagation can change very rapidly, such as when a car equipped with a mobile station turns a street corner. Rapid trend detection is obtained when the environment factors are assigned a relatively high value, such as $SS\_K=2$, $QQ\_K=2$. On the other hand, when the cell embraces relatively flat landscape or countryside, sluggish trend detection is desired, in which case the aforesaid environment factors are assigned a relatively low value, such as $SS\_K=0.5$, $QQ\_K=0.5$. Thus, the trend is given by the difference between the first and the second mean value and can be either amplified or weakened as desired in dependence on the peripheral environment with the aid of the environment factors. The calculated or estimated trend, which thus corresponds to the difference between the first and the second mean values, multiplied by an environment factor, is added to the second mean value, to produce the aforesaid anticipated values of signal level and quality respectively. (Square 3 in the flow chart). The results obtained when calculating the anticipated values of signal level and quality are thus influenced by the values assigned to the two environment factors $SS\_K$, and $QQ\_K$. The results can be further influenced, in a desired manner, by giving the various measurement values or samples different weights or significances in the mean value calculations. This is achieved by selecting the number of measurement values to be included in the first and the second mean values respectively, which corresponds to selecting the length of the two time periods, since the measurement values are sampled each half-second. The number of measurement values or samples in the first time period A1 are designated $SS\_A1$ and the number of samples in the second time period A2 are designated $SS\_A2$. When the measurement values in both time periods are of equal number, the weighting of both mean values are equal. When the number of measurement values in the first time period A1 is fewer than the number of measurement values in the second time period A2, the weighting of each measurement value in the first time period A1 is greater than in the second time period A2. On the other hand, if the number of measurement values in the first time period A1 is fewer than in the second time period A2, weighting of each measurement value in the second time period A2 is lower than in the first time period A1. In a city or town, where the environment in which the mobile station moves can vary very rapidly, it may be appropriate, for instance, to assign a high weighting to the latest measurement values, which is the case when the number of measurement values during the first time period A1 is fewer than during the second time period A2.

The anticipated signal-level and quality values $Z\_SS$, $Z\_QQ$, are used as input data for the actual power regulating process. When regulating transmission power, the input data is compared with certain parameters relating to signal level and quality respectively, these parameters being stored in the computer. In the case of signal level, there is found a first parameter $SS\_DES$ which denotes the desired value, and a second parameter SS_MAX which denotes the maximum signal-level value permitted. With respect to the quality of signal transmission, three different parameters are found, a first parameter QQ_MIN which denotes the least number of bit errors permitted (best permitted quality value); a second parameter, QQ_MAX which denotes the maximum number of bit errors permitted (worst permitted quality value) and a third parameter QQ_DES which denotes the desired quality value. These parameters are marked in the diagram shown in FIG. 5. In addition to the aforesaid anticipated values Z_SS, Z_QQ, the input data used to effect power regulation also includes the latest power output PREV_MS_PWR ordered to the mobile station, that is, the power output at the present time-point $t_0$.

Thus, when regulating power on the basis of the aforesaid input data Z_SS, Z_QQ, PREV_MS_PWR, there is calculated a minimum power output which will ensure connection quality. The calculated, new power output for the next time-point $t_1$ is designated MS_PWR. According to the illustrated example of FIG. 4, the power output is regulated in the following manner. When testing a first condition 4, an expected quality Z_QQ is compared with the worst permitted quality-value QQ_MAX. If the anticipated quality Z_QQ is very poor, meaning that the anticipated number of bit errors in the transmission at the next time-point $t_1$ is fewer than the maximum number of permitted bit errors QQ_MAX, the power output is increased to the maximum permitted/possible power output of the mobile MAX_MS_PWR. (IF Z_QQ>QQ_MAX THEN MS_PWR=MAX_MS_PWR).

If the first condition 4 is not fulfilled a test is carried out on a second condition 5, which checks whether or not the anticipated quality Z_QQ is poorer than the desired quality, meaning that the anticipated number of bit errors during transmission is fewer than the number appropriate for the desired quality QQ_DES. If the second condition 5 is fulfilled, indicating that the anticipated quality Z_QQ is poorer than the desired quality, the power output is increased in a manner which gives the greatest increase in power output. The power output is either increased by 2 dB or is increased by the difference between the desired signal level SS_DES and the calculated anticipated signal level Z_SS. (IF Z_QQ>QQ_DES THEN MS_PWR=MAX (PREV_MS_PWR+2, PREV_MS_PWR+SS_DES-Z_SS)).

If the second condition 5 is not fulfilled either, a third condition 6 is tested in order to ascertain whether or not the anticipated quality Z_QQ is better than the permitted quality or whether the anticipated signal level Z_SS is higher than the permitted signal level, and whether a given number of samples DES_INT have passed since the preceding power decrease. If the third condition 6 is fulfilled, the power output is lowered by 2 dB. (IF (Z_QQ<QQ_MIN OR Z_SS>SS_MAX) AND the number of samples since the preceding power decrease>DEC_INT THEN MS_PWR=PREV_MS_PWR −2 dB).

If none of the aforesaid conditions 4, 5, 6 is fulfilled, this means that the anticipated signal level and signal quality are at the desired level, so that the latest ordered power output PREV_MS_PRW is also maintained at the next time-point $t_1$. The tests made on the aforesaid conditions can be summarized with the following, simplified program lines, the bracketed numerals referring to the flow chart.

(4) IF Z_QQ>QQ_MAX THEN MS_PWR=MAX_MS_PWR
(5) IF Z_QQ>QQ_DES THEN MS_PWR=MAX (PREV_MS_PWR+2, PREV_MS_PWR+SS_DES-Z_SS)
(6) IF (Z_QQ<QQ_MIN OR Z_SS>SS_MAX) AND the number of samples prior to power decrease is then >DEC_INT, MS_PWR will then equal PREV_MS_PWR −2 dB
(7) ELSE MS_PWR=PREV_MS_PWR Thus, subsequent to carrying out the tests above, a new power output is calculated for signals that are to be transmitted from the mobile station to the base station, from and including the next time-point $t_1$. Before the new power output MS_PWR is ordered to the mobile station, a check is made to ascertain that the level of the new power output lies within permitted limits. This check is made, for instance, with the aid of a fourth and a fifth test 8, 9. The fourth test 8 ascertains whether or not the new power output MS_PWR is too low. This is the case if the new power output is lower than a smallest level which corresponds to the maximum permitted or possible power output MAX_MS_PWR minus a maximum number of decibels MAX_DEC. If the test shows that the new output is too low, the power output is raised to the next lowest level. (IF MS_PWR<MAX_MS_PWR-MAX_DEC THEN MS_PWR=MAX_MS_PWR-MAX_DEC).

The fifth and last test 9 ascertains whether or not the new power output is higher than the maximum permitted or possible power output. If this is the case, the new power output is changed to the maximum permitted or possible power output. (IF MS_PWR>MAX_MS_PWR THEN MS_PWR=MAX_MS_PWR).

If none of the two last conditions 8, 9 is fulfilled, the calculated new power output was thus within the permitted limits.

Finally, an order is sent to the mobile station to commanding it to adjust power output to the new calculated power output MS_PWR, which may possibly be the same as the present or instant power output PREV_MS_PWR. (Square 10 in the flow chart). In the aforementioned U.S. standard EIA/TIA, there is a format for orders concerning mobile station power mm and acknowledgement of received orders concerning mobile station power mm that can be utilized. The mobile station computer adjusts the power transmitted from the mobile station upon receiving an order that such adjustment shall take place, so that at the next time-point $t_1$ the mobile station will transmit signals with the new power output MS_PWR calculated in the afore-described manner.

At the next time-point $t_1$, one-half second after the present time-point $t_0$, the aforedescribed method is repeated so as to calculate the next power adjustment, although the time-point designations are moved forward one step on the time axis t in FIG. 6, so that the time-point designated to again designates the "present" timepoint.

Depending on the transmission time between base station and mobile station and whether power is regulated or adjusted in a base station or a mobile station, certain time differences may occur in practice between the time at which power adjustment is effected and the time at which an order to adjust the power is issued. Consequently, in some instances, the time-point $t_2$ in FIG. 5 or any arbitrary time-point t>to can designate the next time-point with regard to the anticipated values Z_SS and Z_QQ and the new power output MS_PWR.

The invention can be applied within different types of systems, including systems which apply FDMA and those which apply TDMA or CDMA. Irrespective of the system in which the invention is applied, it is, of course, important that the signals measured are transmitted by the correct station. When the method is applied with a mobile radio system of the FDMA-type, in which the transmission times on the radio frequencies are not divided into time slots but in which each connection can constantly use one radio frequency, it is, of course, possible to choose the time-points at which signal level and signal quality are measured comparatively freely without taking time slots into account. On the other hand, when the invention is applied in a mobile radio system of the TDMA-type, it is necessary to select the time-points within the correct time slot.

Other methods of defining and measuring the quality of an established communication channel which differ from the methods described above are, of course, conceivable within the scope of the invention.

Base stations and mobile stations for digital mobile radio systems include processors and memories which can be used appropriately for processing and storing measurement values, the mean values and anticipated mean values in accordance with the invention. As will be understood, separate processors and memories can be used instead, when practicing the inventive method, if so desired. The selection of an appropriate processor for use in a particular stage of the inventive method will naturally depend on the extent to which the measurement values are collected, stored and processed in the base station or in the mobile station.

In the case of a mobile radio station constructed in accordance with the European standard GSM, this system including a "Base Station Controller" BSC for controlling several base stations, storage and processing of the measurement values may, instead, be implemented in said "Base Station Controller" BSC. The actual measurements themselves are taken in either the base station or the mobile station, in the aforedescribed manner.

The invention has been described in terms of specific embodiments to facilitate understanding. The above embodiments, however, are illustrative rather than limitative. It will be readily apparent to one of ordinary skill in the art that departures may be made from the specific embodiments shown above without departing form the essential spirit and scope of the invention. Therefore, the invention should not be regarded as being limited to the above examples, but should be regarded instead as being fully commensurate in scope with the following claims.

We claim:

1. A method for regulating the transmission power of radio signals transmitted between a mobile station and a base station in a digital mobile radio system, comprising:
   calculating a first signal strength value of a radio signal transmission during a first, most recent time period;
   calculating a second signal strength during a second time period immediately preceding said first time period;
   calculating a first quality value of said signal transmission during said first time period an a second quality value of said signal transmission during said second time period;
   calculating an anticipated value of a signal strength of said signal transmission of a next point that is after the first time period based on said first and second signal strength values and an anticipated level of transmission power that is equal to a transmission power level at a present time point;
   calculating an anticipated value of a quality of said signal transmission at a next time point that is after the first time period based on said first and second quality values and the anticipated level of transmission power; and
   regulating said transmission power using said anticipated values of signal strength and signal quality to increase said transmission power at said next time point when said anticipated transmission quality is less than a desired value and to decrease said transmission power when either said anticipated quality is greater than highest permitted quality or said anticipated value of the signal strength is greater than a maximum value.

2. A method according to claim 1, wherein said value calculating steps include sampling the measurement values of signal strength and quality, respectively, at time intervals of constant duration within said first and second time periods, an wherein said first time period includes a first number of samples an said second time period includes a second number of samples.

3. A method according to claim 2, wherein said first number of samples taken during said firs time period is less than said second number of samples and wherein said first samples are weighted more heavily than said second samples.

4. A method according to claim 1, wherein said calculating of said anticipated values of the signal strength level includes adding said second signal strength value to a signal strength difference between said first and second signal strength values, said difference being multiplied by an environmental factor, and wherein said calculating of said anticipated value of the signal transmission quality includes adding said second quality value to a quality difference of said signal transmission between said first and second quality values, aid quality difference being multiplied by an environmental factor.

5. A method according to claim 1, further comprising:
   increasing said transmission power at said next time point to a maximum permitted power output when said anticipated quality value is less than a lowest permitted value, and increasing said transmission power by at least 2dB when said anticipated quality value is greater than the lowest permitted value but lower than the desired value.

6. A method according to claim 1, wherein each of the steps of calculating said first and second signal transmission quality values further comprises:
   estimating a bit error content during signal transmission at either the base station or the mobile station; and
   utilizing said estimated bit error content as a measurement of signal transmission quality.

7. A method according to claim 1, further comprising:
   regulating the transmission power of he mobile station.

8. A method according to claim 1, further comprising:

regulating the transmission power of the base station.

9. A method for regulating a digital mobile radio systems the transmission power of radio signals transmitted from a mobile station during radio communication between said mobile station and a controlling base station, the power of the radio signals transmitted from said mobile station being regulated continuously to be as low as possible such as to not interfere with radio communications involving other mobile stations but sufficiently high for radio communication between said base and said mobile station to continue without loss of excessive information, comprising:

calculating a first signal strength value of a radio signal transmission during a first, most recent time period;

calculating a second signal strength during a second time period immediately preceding said first time period;

calculating a first quality value of said signal transmission during said first time period and a second quality value during said second time period;

calculating an anticipated value of a signal strength of said signal transmission at a next time point that is after the first time period based on said first and second signal strength values and an anticipated level of transmission power that is equal to a transmission power level at a present time point;

calculating an anticipated value of a quality of said signal transmission at a next time point that is after the first time period base on said first second quality values and the anticipated level of transmission power; and regulating said transmission power using said anticipated values to increase said transmission power at said next time point when said anticipated transmission quality is less than a desired value and to decrease said transmission power when either said anticipated quality is greater than a highest permitted quality or said anticipated value of the signal strength is greater than a maximum value.

* * * * *